United States Patent
Wang et al.

(10) Patent No.: US 10,128,117 B2
(45) Date of Patent: Nov. 13, 2018

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Wenbo Wang, Shanghai (CN); Hanming Wu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/711,479

(22) Filed: Sep. 21, 2017

(65) Prior Publication Data

US 2018/0012765 A1 Jan. 11, 2018

Related U.S. Application Data

(62) Division of application No. 14/988,555, filed on Jan. 5, 2016, now Pat. No. 9,799,525.

(30) Foreign Application Priority Data

Feb. 17, 2015 (CN) .......................... 2015 1 0086591

(51) Int. Cl.
*H01L 21/283* (2006.01)
*H01L 29/423* (2006.01)
(Continued)

(52) U.S. Cl.
CPC ........ *H01L 21/283* (2013.01); *H01L 29/4236* (2013.01); *H01L 29/51* (2013.01);
(Continued)

(58) Field of Classification Search
CPC ..................................................... H01L 21/283
See application file for complete search history.

(56) References Cited

U.S. PATENT DOCUMENTS

| 5,364,810 A * | 11/1994 | Kosa ................. H01L 21/26586 257/E21.345 |
| 2009/0108343 A1* | 4/2009 | Nemtsev ............... H01L 29/407 257/330 |

(Continued)

*Primary Examiner* — Eugene Lee
(74) *Attorney, Agent, or Firm* — Innovation Counsel LLP (57) ABSTRACT

A semiconductor device may include the following elements: a first doped region; a second doped region, which contacts the first doped region; a third doped region, which contacts the first doped region; a first dielectric layer, which contacts the above-mentioned doped regions; a first gate member, which is conductive and comprises a first gate portion, a second gate portion, and a third gate portion, wherein the first gate portion contacts the first dielectric layer, wherein the second gate portion is positioned between the first gate portion and the third gate portion, and wherein a width of the second portion is unequal to a width of the third gate portion; a doped portion, which is positioned between the third gate portion and the third doped region; a second gate member; and a second dielectric layer, which is positioned between the third gate portion and the second gate member.

6 Claims, 8 Drawing Sheets

(51) Int. Cl.
*H01L 29/51* (2006.01)
*H01L 29/66* (2006.01)
*H01L 29/739* (2006.01)
*H01L 21/28* (2006.01)
*H01L 29/08* (2006.01)

(52) U.S. Cl.
CPC .... *H01L 29/66356* (2013.01); *H01L 29/7391* (2013.01); *H01L 21/28273* (2013.01); *H01L 29/0834* (2013.01); *H01L 29/42336* (2013.01)

(56) References Cited

U.S. PATENT DOCUMENTS

| | | |
|---|---|---|
| 2011/0278542 A1 | 11/2011 | Bangsaruntip |
| 2011/0303950 A1 | 12/2011 | Lauer |
| 2012/0228706 A1 | 9/2012 | Sugizaki |
| 2012/0267609 A1 | 10/2012 | Liang |
| 2013/0069115 A1 | 3/2013 | Nakazawa |
| 2014/0084362 A1* | 3/2014 | Schloesser ........ H01L 29/66734 257/330 |

* cited by examiner

SEMICONDUCTOR DEVICE, RELATED MANUFACTURING METHOD, AND RELATED ELECTRONIC DEVICE

CROSS-REFERENCE TO RELATED APPLICATION

This is a divisional of U.S. application Ser. No. 14/988,555 filed Jan. 5, 2016, which application claims priority to and benefit of Chinese Patent Application No. 201510086591.3, filed on 17 Feb. 2015; each of which are incorporated herein by reference in their entireties.

BACKGROUND

The technical field is related to a semiconductor device, a method for manufacturing the semiconductor device, and an electronic device that includes the semiconductor device.

A semiconductor device, such as a transistor, may be used in a memory device. A memory device may include a plurality of memory cells. Conventionally, each memory cell may include a plurality of transistors. With a plurality of transistors in each memory cell, the memory cells may occupy a significant amount of space and may consume a significant amount of power. Therefore, improvements to the size and energy efficiency of the memory device may be required or desired.

SUMMARY

An embodiment may be related to a semiconductor device. The semiconductor device may include a first doped region, a second doped region, a third doped region, a first dielectric layer, a first gate member, a doped portion, a second dielectric layer, a second gate member, a source region, and a drain region. The first doped region may have a first dopant type. The second doped region may directly contact the first doped region and may have a second dopant type. The third doped region may directly contact the first doped region and may have the second dopant type. The first dielectric layer may directly contact each of the first doped region, the second doped region, and the third doped region. The first gate member may be conductive and may include a first gate portion, a second gate portion, a third gate portion, and a fourth gate portion. The first gate portion may directly contact the first dielectric layer and may be positioned between the second doped region and the third doped region. The second gate portion may be positioned between the first gate portion and the third gate portion. A width of the second portion may be unequal to a width of the third gate portion. The fourth gate portion may be positioned between two portions of the first doped region. The doped portion may be positioned between the third gate portion and the third doped region. The second dielectric layer may overlap and directly contact the third gate portion. The second gate member may be conductive, may overlap and directly contact the second dielectric layer, and may overlap the first gate member. The source region may be positioned at the second doped region and may directly contact the second doped region. The drain region may be positioned at the third doped region and may directly contact the third doped region.

The second gate portion may partially overlap the first gate portion without completely overlapping the first gate portion. The width of the second gate portion may be less than the width of the third gate portion. The width of the second gate portion may be unequal to (and less than) a width of the first gate portion.

The first gate member may have the first dopant type. The doped portion may have the first dopant type. A material of the doped portion may be identical to a material of the first doped region. The doped portion may directly contact each of the third doped region, the second gate portion, and the third gate portion.

The second dielectric layer may directly contact each of a side of the third gate portion and a side of the doped portion. The side of the third gate portion and the side of the doped portion may be positioned on a same geometric plane.

At least one of a dielectric constant of the first dielectric layer and a dielectric constant of the second dielectric layer may be greater than or equal to 3.9. At least one of the dielectric constant of the first dielectric layer and the dielectric constant of the second dielectric layer may be greater than or equal to 20. At least one of the first dielectric layer and the second dielectric layer may be formed of at least one of silicon oxide, silicon nitride, silicon oxynitride, hafnium oxide, hafnium silicon oxide, hafnium silicon oxynitride, lanthanum oxide, zirconium oxide, zirconium silicon oxide, titanium oxide, tantalum oxide, barium strontium titanium oxide, barium titanium oxide, strontium titanium oxide, and aluminum oxide.

The semiconductor device may include a first spacer and a second spacer. A portion of the second gate member may be positioned between the first spacer and the doped portion. A portion of the second dielectric layer may directly contact each of the doped portion and the portion of the second gate member and may be positioned between the doped portion and the portion of the second gate member.

A portion of the second dielectric layer may directly contact each of a portion of the first dielectric layer and a portion of the second gate member and may be positioned between the portion of the first dielectric layer and the portion of the second gate member.

An embodiment may be related to a method for manufacturing a semiconductor device. The method may include the following steps: providing a first doped region, which may have a first dopant type; providing a second doped region, which may directly contact the first doped region and may have a second dopant type; providing a third doped region, which may directly contact the first doped region and may have the second dopant type; providing a first dielectric layer, which may directly contact each of the first doped region, the second doped region, and the third doped region; providing a first gate member, which may be conductive and may include a first gate portion, a second gate portion, and a third gate portion, wherein the first gate portion may directly contact the first dielectric layer and may be positioned between the second doped region and the third doped region, wherein the second gate portion may be positioned between the first gate portion and the third gate portion, and wherein a width of the second portion may be unequal to a width of the third gate portion; providing a second gate member, which may be conductive and may overlap the second dielectric layer; providing a source region at the second doped region; and providing a drain region at the third doped region.

The method may include the following steps: providing a substrate member that has a trench; providing a first dielectric material layer inside the trench; providing a protective member inside the trench, such that the protective member is positioned between two portions of the first dielectric material layer; partially protecting the first dielectric material layer using the protective member when partially removing the first dielectric material layer to form the first dielectric layer, wherein a top side of the first dielectric layer is lower than a top side of the substrate member and is higher than a top side of the first doped region with respect to a bottom of the substrate member; and removing the protective member.

The method may include the following steps: providing a conductive material layer (i.e., a gate material layer) on the first dielectric and on the substrate member, wherein a portion of the conductive material layer is positioned inside the trench; and etching the conductive material and the substrate member to form the first gate member and a remaining substrate member, wherein a surface of the remaining substrate member is flush with the top side of the first dielectric layer.

The method may include the following step: heating at least the first gate member to cause dopant elements to move from the first gate member to the doped portion.

The method may include the following step: configuring a width of a portion of the second gate member to configure a length of a tunnel field-effect transistor structure between the first gate member and the drain region. A portion of the second dielectric layer may directly contact each of the doped portion and the portion of the second gate member and may be positioned between the doped portion and the portion of the second gate member.

At least one of a dielectric constant of the first dielectric layer and a dielectric constant of the second dielectric layer may be greater than or equal to 3.9.

An embodiment may be related to an electronic device. The electronic device may include an electronic component and a semiconductor device. The semiconductor device may be electrically connected to the electronic component and may have one or more of the aforementioned features.

According to embodiments, a semiconductor device may have a tunnel field-effect transistor (TFET) structure or characteristic. Advantageously, operation efficiency of the semiconductor device may be substantially high, power consumption of the semiconductor device may be substantially low, and/or a size of the semiconductor device may be substantially small.

According to embodiments, in a semiconductor device, one or more high-k dielectric layers may isolate one or more gate members. The high-k dielectric layer(s) may enable the semiconductor device to have a substantially large storage capacitance, such that a satisfactory charge retention time may be attained. The high-k dielectric layer(s) may enable optimization of performance of a TEFT structure and/or performance of a metal-oxide-semiconductor field-effect transistor (MOSFET) structure in the semiconductor device. Advantageously, performance of the semiconductor device (and performance of an associated electronic device) may be satisfactory.

The above summary is related to some of many embodiments disclosed herein and is not intended to limit the scope of embodiments.

DETAILED DESCRIPTION

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 1:
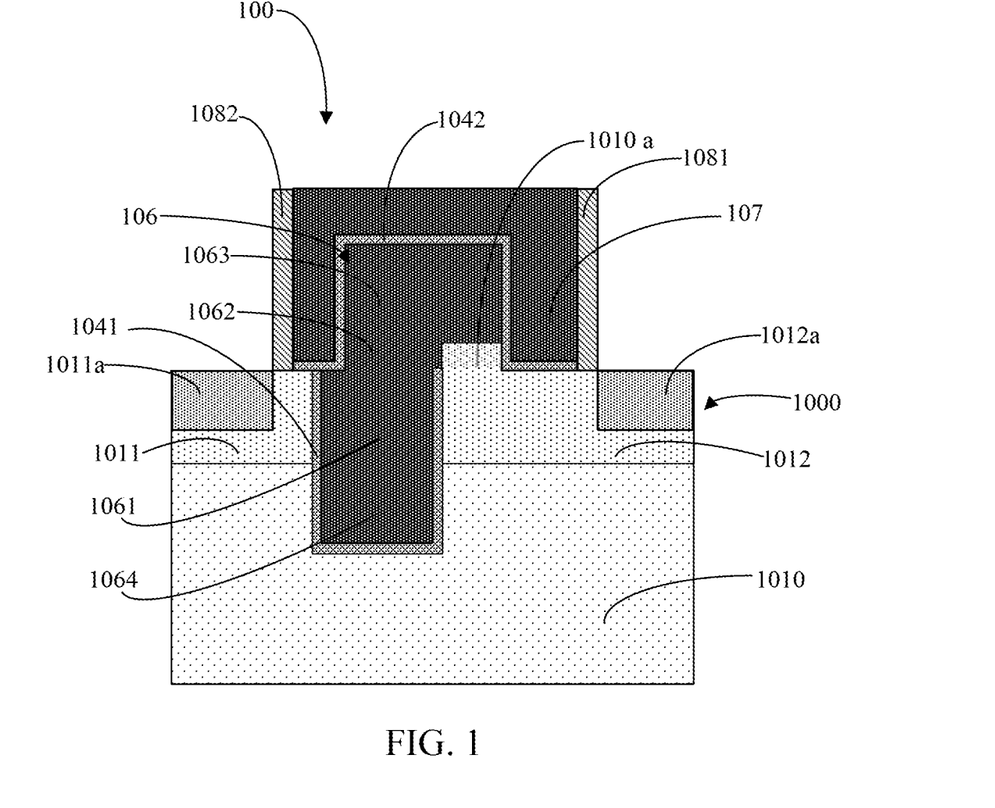
FIG. 1 shows a schematic diagram (e.g., a schematic cross-sectional view) that illustrates elements and/or structures in a semiconductor device in accordance with one or more embodiments.

FIG. 1 shows a schematic diagram (e.g., a schematic cross-sectional view) that illustrates elements and/or structures in a semiconductor device 100 in accordance with one or more embodiments. The semiconductor device 100 may function as a transistor and/or may be utilized in a memory device. The semiconductor device 100 may include a substrate 1000, a dielectric layer 1041, a gate member 106, a doped portion 1010a, a dielectric layer 1042, a gate member 107, a spacer 1081, and a spacer 1082.

The substrate 1000 may be or may include at least one of a monocrystalline silicon substrate, a polycrystalline silicon substrate, a silicon-on-insulator (SOI) substrate, a stacked silicon-on-insulator (SSOI) substrate, a stacked silicon-germanium-on-insulator (S—SiGeOI) substrate, a silicon-germanium-on-insulator (SiGeOI) substrate, and a germanium-on-insulator (GeOI) substrate. The substrate 1000 may include a doped region 1010, a doped region 1011, a doped region 1012, a source region 1011a, and a drain region 1012a.

The doped region 1010 may have a first dopant type. The doped region 1011 may directly contact the doped region 1010 and may have a second dopant type, which may be different from and/or opposite to the first dopant type. The doped region 1012 may directly contact the doped region 1010 and may have the second dopant type. The source region 1011a may be positioned at the doped region 1011, may directly contact the doped region 1011, may have the second dopant type, and may have a higher doping concentration than the doped region 1011. The drain region 1012a may be positioned at the doped region 1012, may directly contact the doped region 1012, may have the second dopant type, and may have a higher doping concentration than the doped region 1012.

In an embodiment, the first dopant type may be p-type, and the second dopant type may be n-type. In an embodiment, the first dopant type may be n-type, and the second dopant type may be p-type.

Three portions of the dielectric layer 1041 may respectively and directly contact the doped region 1010, the doped region 1011, and the doped region 1012. The dielectric layer 1041 may be formed of one or more high-k materials. A dielectric constant of the dielectric layer 1041 may be greater than or equal to 3.9. The dielectric layer 1041 may be formed of at least one of silicon oxide, silicon nitride, and silicon oxynitride. A dielectric constant of the dielectric layer 1041 may be greater than or equal to 20. The dielectric layer 1041 may be formed of at least one of hafnium oxide, hafnium silicon oxide, hafnium silicon oxynitride, lanthanum oxide, zirconium oxide, zirconium silicon oxide, titanium oxide, tantalum oxide, barium strontium titanium oxide, barium titanium oxide, strontium titanium oxide, and aluminum oxide. A minimum thickness of the dielectric layer 1041 may be in a range of 1 nm to 20 nm.

The high-k dielectric layer 1041 may enable the semiconductor device 100 to have a substantially large storage capacitance, such that a sufficiently long charge retention time may be attained. The high-k dielectric layer 1041 may enable optimization of performance of a tunnel field-effect transistor (TEFT) structure and/or performance of a metal-oxide-semiconductor field-effect transistor (MOSFET) structure in the semiconductor device 100. Advantageously, performance of the semiconductor device may be satisfactory.

The gate member 106 may be formed of one or more conductive materials, such as a doped polycrystalline silicon material. The gate member 106 may have the first dopant type, same as the dopant type of the doped region 1010 and different from (and opposite to) the dopant type of each of the doped regions 1011 and 1012. The gate member 106 may include a gate portion 1061, a gate portion 1062, a gate portion 1063, and a gate portion 1064.

The gate portion 1061 may directly contact two portions of the dielectric layer 1041, may be positioned between two portions of the dielectric layer 1041, may be positioned between the doped region 1011 and the doped region 1012, and may be positioned between the source region 1011a and the drain region 1012a. The gate portion 1062 may be positioned between the gate portion 1061 and the gate portion 1063. The gate portion 1062 may partially overlap the gate portion 1061 without completely overlapping the gate portion 1061. The gate portion 1062 may partially overlap the gate portion 1063 without completely overlapping the gate portion 1063. Therefore, the gate portion 1062 may be sufficiently spaced from the source region 1011a. A width of the second portion may be unequal to (and less than) a width of the gate portion 1061 and may be unequal to (and less than) a width of the gate portion 1063. The gate portion 1064 may directly contact three portions of the dielectric layer 1041, may be positioned between two portions of the dielectric layer 1041, and may be positioned between two portions of the doped region 1010.

The doped portion 1010a may protrude from the substrate 1000 and may be positioned between the gate portion 1063 and the doped region 1012. The doped portion 1010a may have the first dopant type, same as the dopant type of the gate member 106, given that some of the dopant material in the doped portion 1010a may have come from the gate member 106. A material of the doped portion 1010a may be identical to a material of the doped region 1010 and/or identical to a material of the substrate 1000. Three sides of the doped portion 1010a may respectively and directly contact the doped region 1012, the gate portion 1062, and the gate portion 1063.

The dielectric layer 1042 may overlap and directly contact the gate portion 1063. The dielectric layer 1042 may directly contact each of a side of the gate portion 1063 and a side of the doped portion 1010a. The side of the gate portion 1063 and the side of the doped portion 1010a may be positioned on a same geometric plane that is perpendicular to an interface between the gate portion 1063 and the doped portion 1010a. The dielectric layer 1042 may be formed of one or more high-k materials. A dielectric constant of the dielectric layer 1042 may be greater than or equal to 3.9. The dielectric layer 1042 may be formed of at least one of silicon oxide, silicon nitride, and silicon oxynitride. A dielectric constant of the dielectric layer 1042 may be greater than or equal to 20. The dielectric layer 1042 may be formed of at least one of hafnium silicon oxynitride, lanthanum oxide, zirconium oxide, zirconium silicon oxide, titanium oxide, tantalum oxide, barium strontium titanium oxide, barium titanium oxide, strontium titanium oxide, and aluminum oxide. A minimum thickness of the dielectric layer 1042 may be in a range of 1 nm to 20 nm.

The high-k dielectric layer 1042 may enable the semiconductor device 100 to have a substantially large storage capacitance, such that a sufficiently long charge retention time may be attained. The high-k dielectric layer 1042 may enable optimization of performance of a TEFT structure and/or performance of a MOSFET structure in the semiconductor device 100. Advantageously, performance of the semiconductor device may be satisfactory.

The gate member 107 may formed of one or more conductive materials, such as one or more of a doped polycrystalline silicon material, a metal material, and an alloy material. The gate member 107 may overlap and directly contact the dielectric layer 1042. The gate member 107 may overlap the gate member 106 and may be insulated from the gate member 106 by the dielectric layer 1042.

A first portion of the dielectric layer 1042 (e.g., a right vertical portion of the dielectric layer 1042 illustrated in FIG. 1) may directly contact each of the doped portion 1010a and a first portion of the gate member 107 (e.g., a right portion of the gate member 107 illustrated in FIG. 1) and may be positioned between the doped portion 1010a and the first portion of the gate member 107.

A second portion of the dielectric layer 1042 (e.g., a left horizontal portion of the dielectric layer 1042 illustrated in FIG. 1) may directly contact each of a portion of the dielectric layer 1041 (e.g., a left vertical portion of the dielectric layer 1041 illustrated in FIG. 1) and a second portion of the gate member 107 (e.g., a left portion of the gate member 107 illustrated in FIG. 1) and may be positioned between the portion of the dielectric layer 1041 and the second portion of the gate member 107. The second portion of the dielectric layer 1042 may further directly contact each of the doped region 1011 and the gate portion 1061.

The gate portion 1062, the doped portion 1010a, and/or the gate portion 1063 may be positioned between the first portion of the gate member 107 and the second portion of the gate member 107.

The spacer 1081 and the spacer 1082 may be respectively positioned at two opposite sides of the gate member 107. The spacer 1081 and the spacer 1082 may be respectively and directly contact the two opposite sides of the gate member 107. The spacer 1081 and the spacer 1082 may isolate the gate member 107 (and the gate member 106) from the source region 1011a and the drain region 1012a.

The above-mentioned first portion (e.g., right portion) of the gate member 107 may be positioned between the spacer 1081 and the doped portion 1010a. The first portion of the gate member 107 may be positioned between the spacer 1081 and the first portion (e.g., right vertical portion) of the dielectric layer 1042 and may directly contact each of the spacer 1081 and the first portion of the dielectric layer 1042. The spacer 1082 may directly contact each of the second portion (e.g., left portion) of the gate member 107 and the second portion (e.g., left horizontal portion) of the dielectric layer 1042. A third portion of the dielectric layer 1042 (e.g., the right horizontal portion of the dielectric layer 1042 illustrated in FIG. 1) may directly contact each of the first portion of the gate member 107, the spacer 1081, and the doped region 1012.

Based on the one or more of the above-described structures of the semiconductor device 100, a tunnel field-effect transistor (TFET) structure may be formed and/or embedded between the gate member 106 and the drain region 1012a. A length of the TFET structure may be optimized through configuration of a width of the first portion (e.g., right portion) of the gate member 107, which extends beyond the gate portion 1063. Advantageously, operation efficiency of the semiconductor device may be substantially high, power consumption of the semiconductor device may be substantially low, and/or a size of the semiconductor device 100 may be substantially small. Performance of a memory device associated with the semiconductor device 100 may be substantially satisfactory.

FIG. 2, FIG. 3, FIG. 4, FIG. 5, FIG. 6, FIG. 7, FIG. 8, FIG. 9, FIG. 10, and FIG. 11 show schematic diagrams (e.g., schematic cross-sectional views) that illustrate elements and/or structures formed in a method for manufacturing the semiconductor device 100 in accordance with one or more embodiments. FIG. 12 shows a flowchart that illustrates steps in a method for manufacturing the semiconductor device 100 in accordance with one or more embodiments.

Referring to FIG. 12, the method may include steps S1201, S1202, S1203, S1204, S1205, S1206, S1207, S1208, and S1209. Sequences of some of the steps may be changed in some embodiments.

Figure 2:
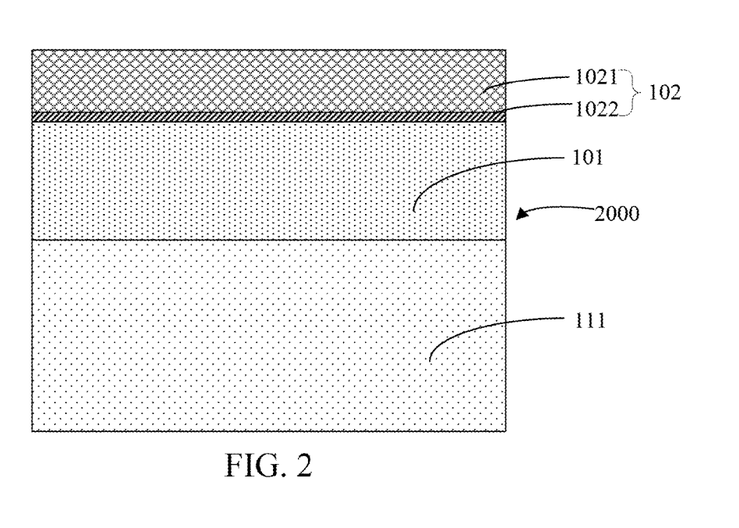
FIG. 2, FIG. 3, FIG. 4, FIG. 5, FIG. 6, FIG. 7, FIG. 8, FIG. 9, FIG. 10, and FIG. 11 show schematic diagrams (e.g., schematic cross-sectional views) that illustrate elements and/or structures formed in a method for manufacturing a semiconductor device in accordance with one or more embodiments.
Figure 3:
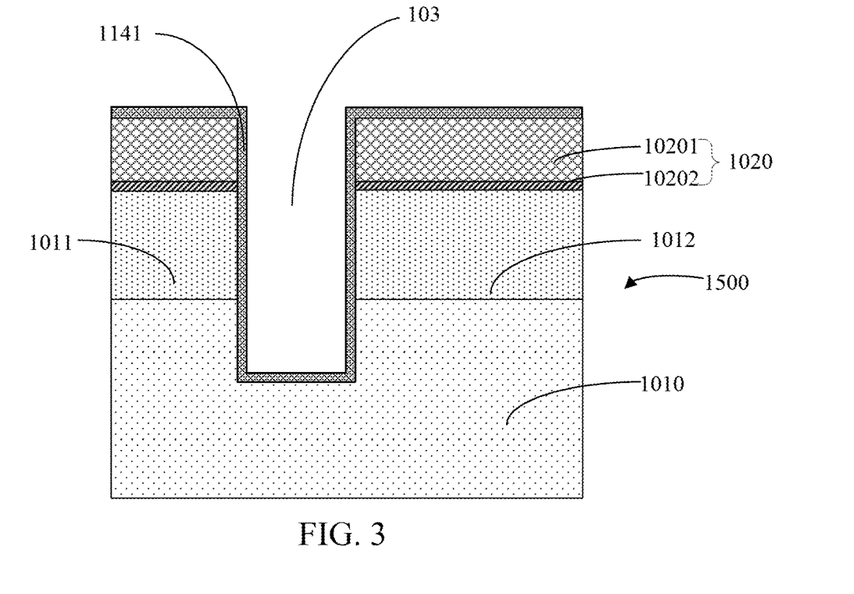

Referring to FIG. 12, FIG. 2, and FIG. 3, the step S1201 may include using a substrate material member 2000 to form a substrate member 1500 that has a trench 103. The substrate material member 2000 may include a doped region 111 and a doped region 101. The substrate material member 2000 may be formed of the material(s) of the substrate 1000 discussed above. The doped region 111 may have the first dopant type. The doped region 101 may have the second dopant type. The step S1201 may include the following sub-steps: preparing the substrate material member 2000; providing a mask layer 102 on the substrate material member 2000; patterning (e.g., through lithography) the mask layer 1020 to form a patterned mask 1020; etching the substrate material member 2000 through the patterned mask 1020 to form the trench 103.

As a result, the substrate member 1500, which includes the doped region 1010, the doped region 1011, and the doped region 1012, may be formed. The doped region 1010 may be a remaining portion of the doped region 111. The doped region 1011 and the doped region 1012 may be remaining portions of the doped region 110 and may be separated by the trench 103.

The mask layer 102 may include a silicon oxide layer 1022 and a silicon nitride layer 1021 positioned on the silicon oxide layer 1022. The pattern mask 1020 may include a silicon oxide layer 10202 and a silicon nitride layer 10201 positioned on the silicon oxide layer 10202.

Referring to FIG. 12 and FIG. 3, the step S1202 may include providing a dielectric material layer 1141 inside the trench 103. The dielectric material layer 1141 may be formed of the material(s) of the dielectric layer 1041 discussed above. The dielectric material layer 1141 may be formed through one or more of a chemical vapor deposition process, an atomic deposition process, and a magnetron sputtering process. A minimum thickness of the dielectric material layer 1141 may be in a range of 1 nm to 20 nm. Some portions of the dielectric material layer 1141 may be positioned on inner sidewalls and the bottom of the trench 103. Some portions of the dielectric material layer 1141 may be positioned on and directly contact some portions of the patterned mask 1020.

Figure 4:
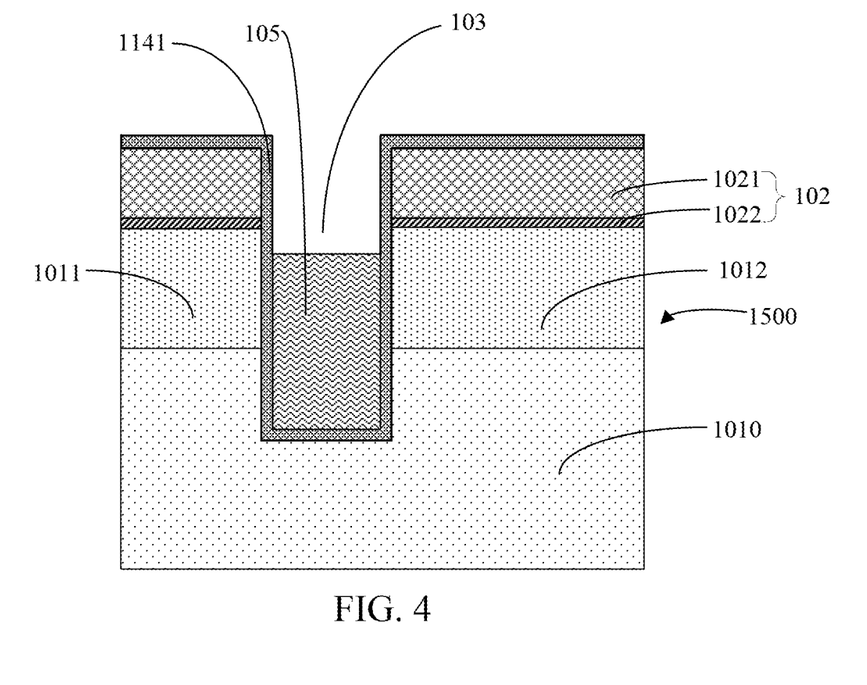

Referring to FIG. 12, FIG. 3, and FIG. 4, the step S1203 may include providing a protective member 105 inside the trench 103, such that the protective member 105 may be positioned between two portions of the dielectric material layer 1141. A top side of the protective member 105 may be lower than a top side of the substrate member 1500 (i.e., top sides of the doped regions 1011 and 1012) and may be higher than a top side of the doped region 1010. The protective member 105 may be formed of at least one of a bottom anti-reflective coating (BARC) material, e.g. a silicon-rich polymer material, and an amorphous carbon material. The protective material member 105 may partially protect the dielectric material layer 1141 for ensuring suitable dimensions of the subsequently formed dielectric layer 1041.

Figure 5:
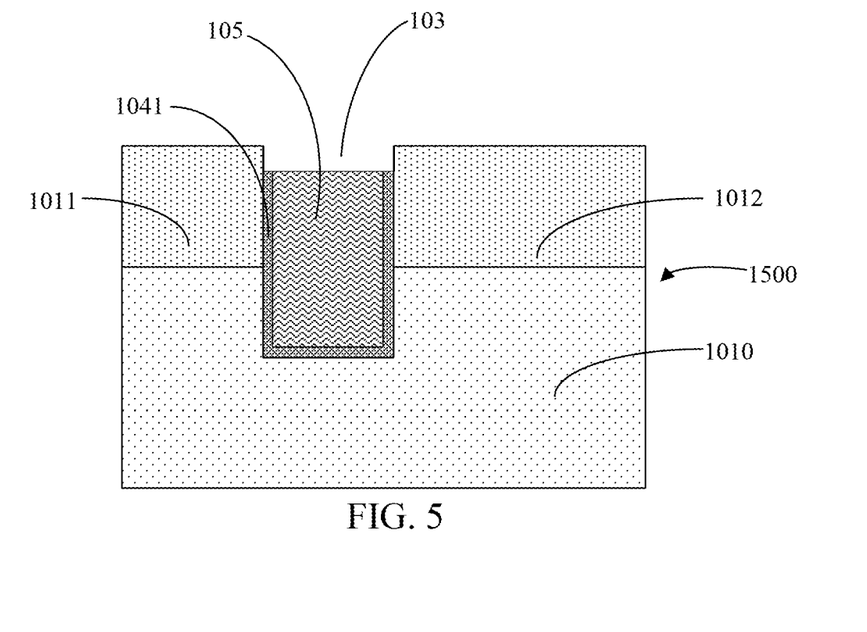

Referring to FIG. 12, FIG. 4, and FIG. 5, the step S1204 may include partially protecting the dielectric material layer 1141 using the protective member 105 when partially removing the dielectric material layer 1141 to form the dielectric layer 1041. The dielectric layer 1042 may have structures, features, and advantages discussed above with reference to FIG. 1. A top side of the dielectric layer 1041 may be substantially defined by the top side of the protective member 105, may be lower than the top side of the substrate member 1500 (i.e., top sides of the doped regions 1011 and 1012), and may be higher than the top side of the doped region 1010.

The dielectric material layer 1141 may be partially removed through an etch-back process, which may include a dry etching process or a wet etching process. The patterned mask 102 may also be removed through the etch-back process and/or through a subsequent etching process. In the one or more etching processes in the step S1204, the etching rates for the dielectric material layer 1141 and the patterned mask 102 may the substantially higher than the etching rates for the substrate member 1500 and the protective member 105.

Figure 6:
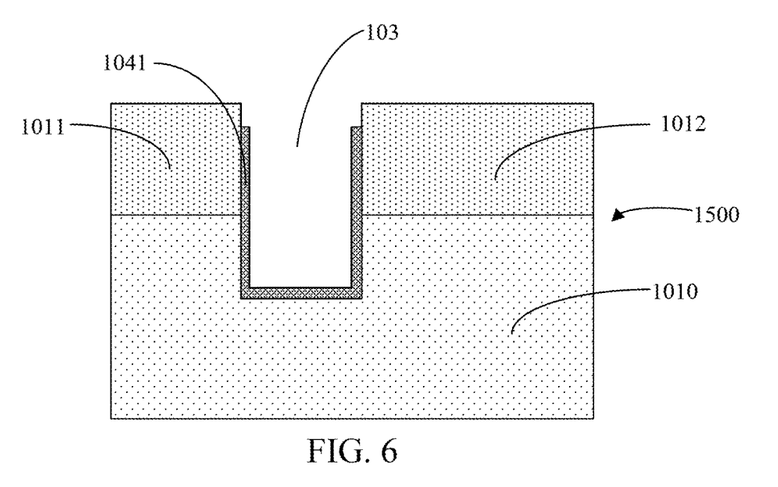

Referring to FIG. 12, FIG. 5, and FIG. 6, the step S1205 may include removing the protective member 105. The protective member 105 may be removed through an etching process (e.g., a dry etching process and/or a wet etching process), in which the etching rate for the protective member 105 may be substantially higher than the etching rates for the dielectric layer 1041 and the substrate member 1500.

Referring to FIG. 12, FIG. 6, FIG. 7, and FIG. 8, the step S1206 may include forming the gate member 106 and a protrusion configured for forming the doped portion 1010a. The step S1206 may include the following sub-steps: providing a gate material layer 1061 on the substrate member 1500 and on the dielectric layer 1041, wherein a portion of the gate material layer 1061 may be positioned inside the trench 103 and positioned between two portions of the dielectric layer 1041; optionally planarizing the gate material layer 1061; and partially removing (e.g., through etching) the gate material layer 1061 and the substrate member 1500 until the top side of the dielectric layer 1041 to form the gate member 106 and a remaining substrate member 1200. The remaining substrate member 1200 may be a remaining portion of the substrate member 1500 and may include the protrusion. A top surface of the remaining substrate member 1200 may be flush with the top side of the dielectric layer 1041.

Figure 7:
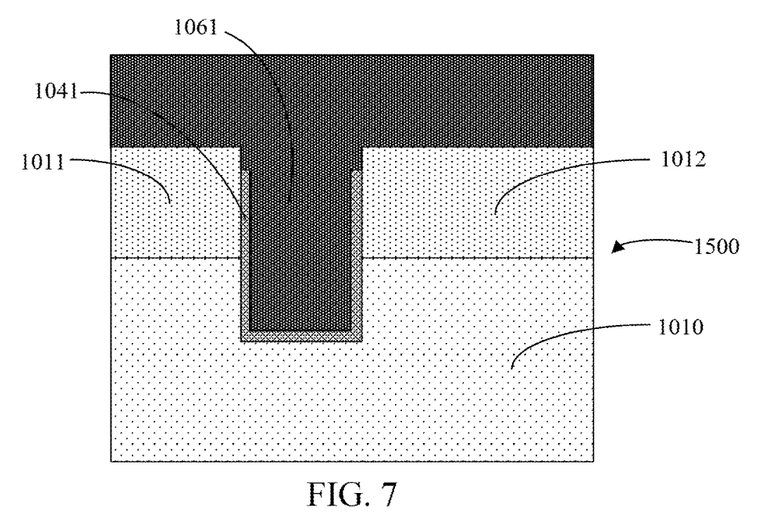

The gate material layer 1061 may be formed through depositing a polycrystalline material (on the substrate member 1500 and the dielectric layer 1041) and doping the polycrystalline material in-situ during the deposition process. The deposition process may include at least one of chemical vapor deposition (CVD), low-temperature chemical vapor deposition (LTCVD), low pressure chemical vapor deposition (LPCVD), rapid thermal chemical vapor deposition (LTCVD), plasma-enhanced chemical vapor deposition (PECVD), sputtering, and physical vapor deposition (PVD).

The in-situ doping may involve ionizing, separating, and accelerating dopant atoms to form an ion beam for doping impurities into the polycrystalline silicon material. Advantageously, the impurities may be substantially uniformly distributed in the polycrystalline silicon material. In an embodiment, boron (B) and/or germanium (Ge) may be used in the in-situ doping, such that the gate material layer 1061 may have p-type impurities. In an embodiment, phosphorus (P) or arsenic (As) may be used in the in-situ doping, such that the gate material layer 1061 may have n-type impurities.

The gate material layer 1061 may be planarized through a chemical-mechanical planarization process.

Figure 8:
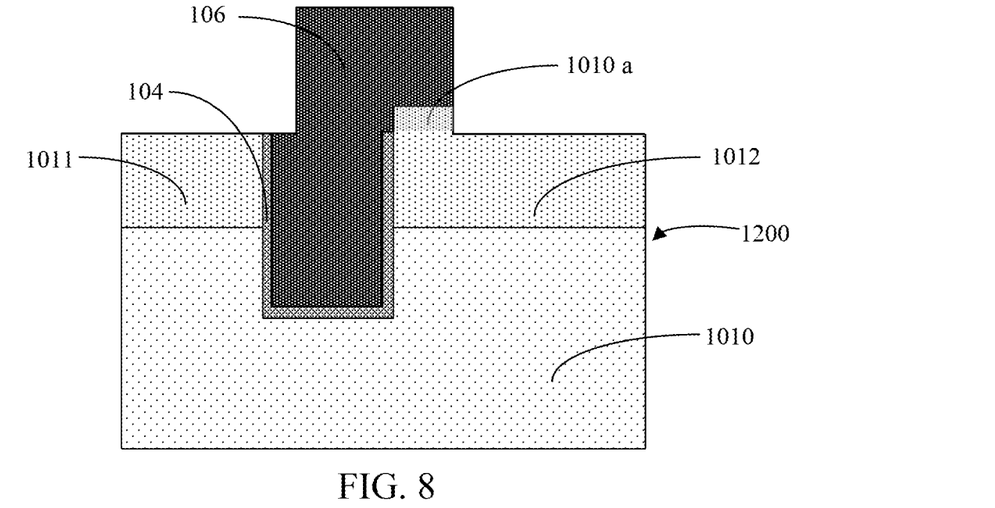

The step S1206 may include the following sub-steps: forming a mask material layer (e.g., a hard mask layer) on the gate material layer 1061; patterning the mask material layer (e.g., through lithography and/or etching) to form a patterned mask; and etching, through the patterned mask, the gate material layer 1061 and the substrate member 1500 until the top side of the dielectric layer 1041. As a result, the gate member 106 and the remaining substrate member 1200 may be formed. The gate member 106 may have structures and features discussed above with reference to FIG. 1. The protrusion may have some of the structures and features associated with the doped portion 1010a discussed above with reference to FIG. 1.

The method may include heating (e.g., though a high-temperature annealing process) at least the gate member 106 to cause dopant elements to move from the gate member 106 to the protrusion to form the doped portion 1010a. Advantageously, contact between the gate member 106 and the doped portion 1010a (which is part of the subsequently formed substrate 1000) may be optimized, and the dopant type of the doped portion 1010a may be substantially identical to the dopant type of the gate member 106. The heating process may be performed in the step S1206 and/or one or more subsequent steps in the manufacturing process of the semiconductor device 100.

Referring to FIG. 12, FIG. 8, FIG. 9, and FIG. 10, the step S1207 may include forming the dielectric layer 1042 and forming the gate member 107. The dielectric layer 1042 and the gate member 107 may have structures, features, and advantages discussed above with reference to FIG. 1.

Figure 9:
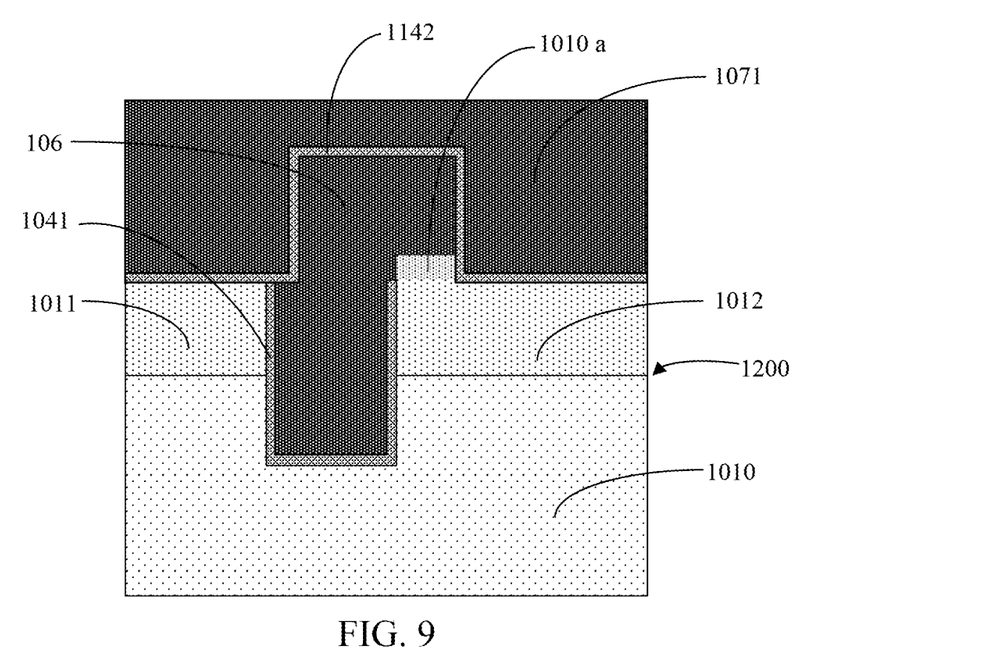
Figure 10:
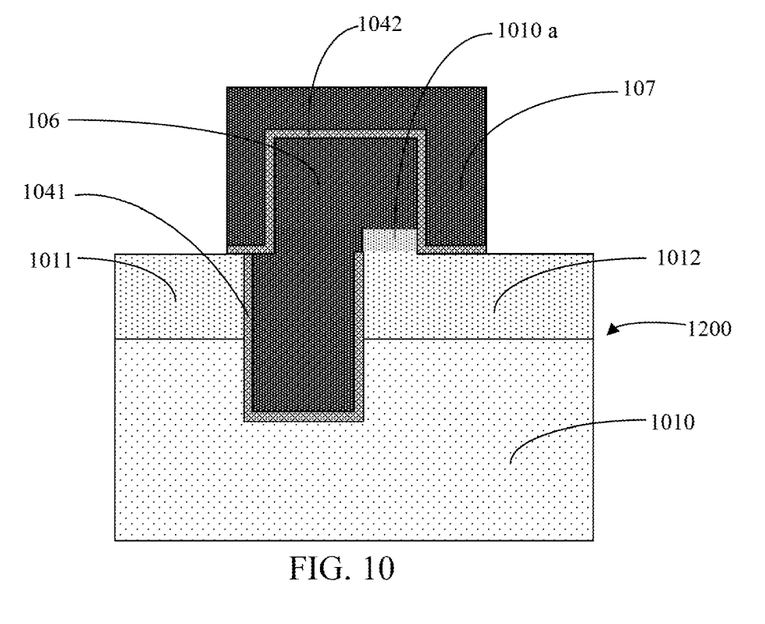

The step S1207 may include the following sub-steps: forming a dielectric material layer 1142 on the gate member 106 and on the remaining substrate member 1200; forming a gate material layer 1071 on the dielectric material layer 1142; forming a mask material layer (e.g., a photoresist layer) on the gate material layer 1071; patterning (e.g., through lithography) the mask material layer to form a patterned mask; and etching, through the patterned mask, the gate material layer 1071 and dielectric material layer 1142 until a top surface of the remaining substrate member 1200. As a result, the gate member 107 and the dielectric layer 1042 may be formed.

The dielectric material layer 1142 may be formed using one or more of a chemical vapor deposition process, an atomic deposition process, and a magnetron sputtering process. A minimum thickness of the dielectric material layer 1142 may be in a range of 1 nm to 20 nm.

The gate material layer 1071 may be formed of at least one of a metal material, an alloy material, and a doped polycrystalline silicon material.

The method may include the following step: configuring a horizontal width of a portion of the gate member 107, e.g., the right portion of the gate member 107 illustrated in FIG. 10, to configure (and optimize) a length of a tunnel field-effect transistor (TFET) structure between the gate member 106 and the subsequently formed drain region 1012a. The configuration of the horizontal width of the portion of the gate member 107 may be performed in the step S1207 and/or one or more other steps in the manufacturing process of the semiconductor device 100.

A portion of the dielectric layer 1042, e.g., the right horizontal portion of the dielectric layer 1042 illustrated in FIG. 10, may directly contact each of the doped portion 1010a and the portion of the gate member 107 and may be positioned between the doped portion 1010a and the portion of the gate member 107.

Figure 11:
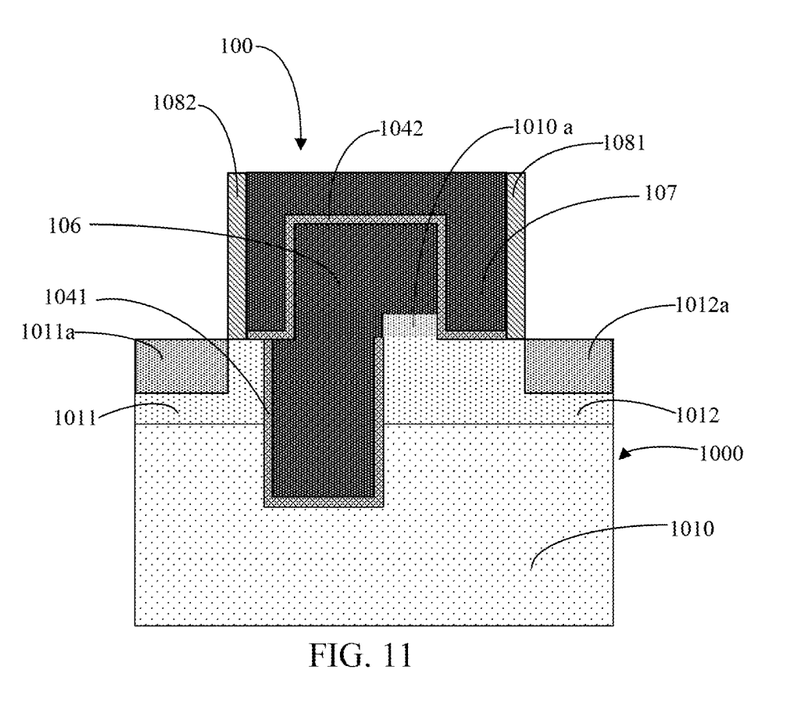
Figure 12:
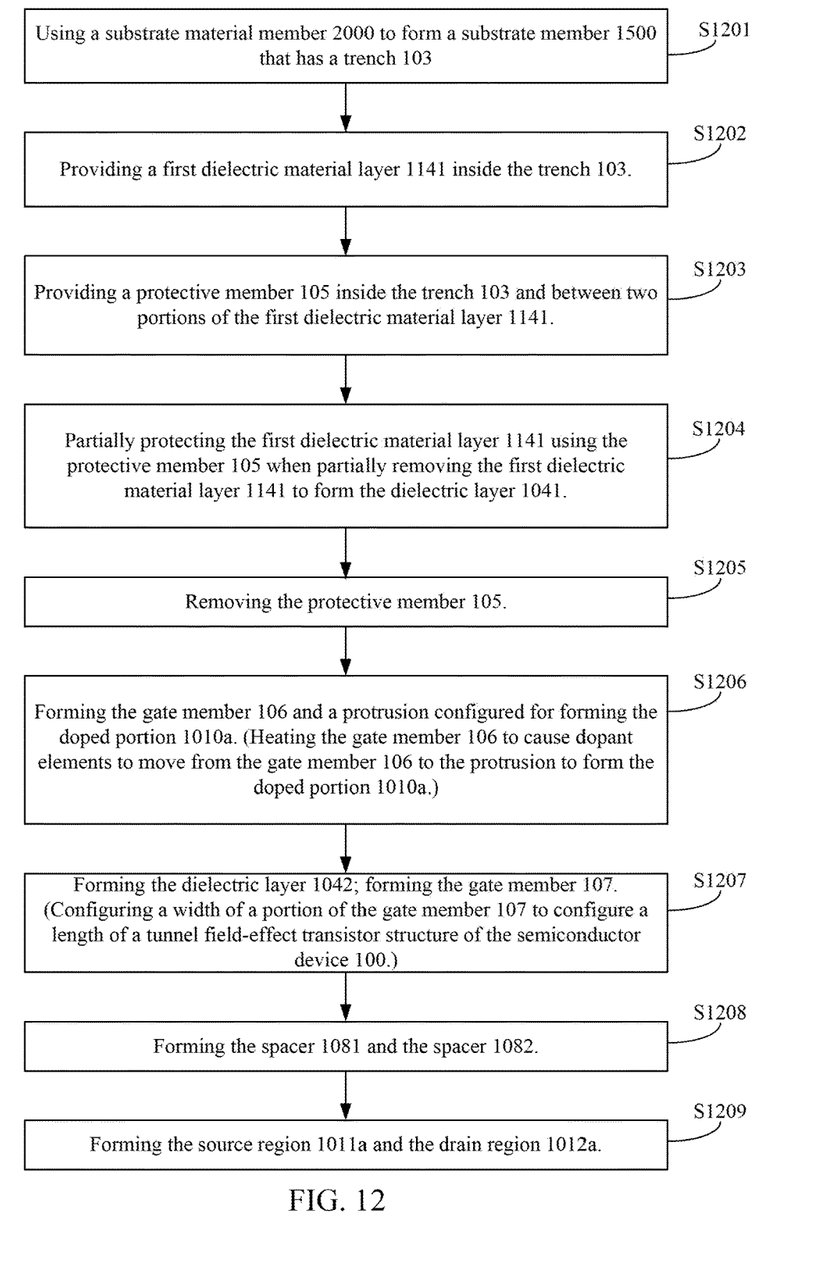
FIG. 12 shows a flowchart that illustrates steps in a method for manufacturing a semiconductor device in accordance with one or more embodiments.

Referring to FIG. 12, FIG. 10, and FIG. 11, the step S1208 may include forming the spacer 1081 and the spacer 1082. The step S1208 may include the following sub-steps: forming an insulating material layer on the structure resulted from the step S1207; forming a mask material layer (e.g., a photoresist layer) on the insulating material layer; patterning (e.g., through lithography) the mask material layer to form a patterned mask; and etching, through the patterned mask, the insulating material layer to form the spacer 1081 and the spacer 1082.

Referring to FIG. 12, FIG. 10, and FIG. 11, the step S1209 may include forming the source region 1011a and the drain region 1012a. The step S1209 may include performing ion implantation on the gate member 107 and on exposed portions of the doped regions 1011 and 1012 (i.e., exposed portions of the remaining substrate member 1200). Impurities that have the second dopant type may be used in the ion implantation. The exposed portions of the doped regions 1011 and 1012 are not shielded by any of the gate member 107, the spacer 1081, and the spacer 1082 during the ion implantation. As a result, the source region 1011a may be formed at the doped region 1011 and may have a higher doping concentration than the doped region 1011, and the drain region 1012a may be formed at the doped region 1012 and may have a higher doping concentration than the doped region 1012. The resulted substrate 1000 may include the doped region 1010, the doped region 1011, the doped region 1012, the doped portion 1010a, the source region 1011a, and the drain region 1012a. The resulted semiconductor 100 may have the structures and advantages discussed with reference to FIG. 1.

According to embodiments, the semiconductor device 100 may have an optimized tunnel field-effect transistor (TFET) structure between the gate member 106 and the drain region 1012a. Advantageously, operation efficiency of the semiconductor device 100 may be substantially high, power consumption of the semiconductor device 100 may be substantially low, and/or a size of the semiconductor device 100 may be substantially small.

According to embodiments, the high-k dielectric layers 1041 and 1042 may enable the semiconductor device 100 to have a substantially large storage capacitance, such that a satisfactory charge retention time may be attained. The high-k dielectric layers 1041 and 1042 may optimize performance of the TEFT structure and/or performance of a metal-oxide-semiconductor field-effect transistor (MOSFET) structure in the semiconductor device 100. Advantageously, performance of the semiconductor device 100 (and an associated memory device) may be satisfactory.

Figure 13:
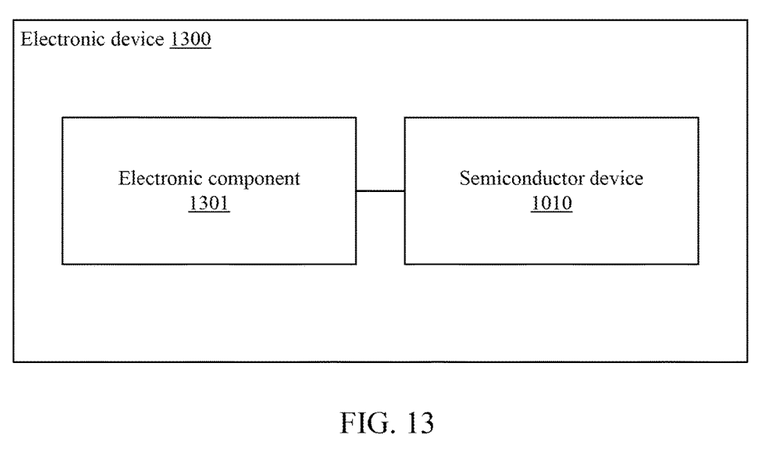
FIG. 13 shows a schematic block diagram that illustrates elements in an electronic device in accordance with one or more embodiments.

FIG. 13 shows a schematic block diagram that illustrates elements in an electronic device 1300 in accordance with one or more embodiments. The electronic device 1300 may include an electronic component 1301 and the semiconductor device 100 that is electrically connected to the electronic component 1301. The semiconductor device 100 may have the above-discussed features.

In an embodiment, the electronic device 1300 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 1300 may be or may include an intermediate product (e.g., a mobile phone main board) or module including a semiconductor device that may have one or more of the features and advantages discussed above.

According to embodiments, a semiconductor device may have a tunnel field-effect transistor (TFET) structure or characteristic. Advantageously, operation efficiency of the semiconductor device may be substantially high, power consumption of the semiconductor device may be substantially low, and/or a size of the semiconductor device may be substantially small.

According to embodiments, in a semiconductor device, one or more high-k dielectric layers may separate conductive members, such as one or more gate members. The high-k dielectric layer(s) may enable the semiconductor device to have a substantially large storage capacitance, such that a satisfactory charge retention time may be attained. The high-k dielectric layer(s) may optimize performance of a TEFT structure and/or performance of a metal-oxide-semiconductor field-effect transistor (MOSFET) structure in the semiconductor device. Advantageously, performance of the semiconductor device (and performance of an associated electronic device) may be satisfactory.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
   providing a first doped region, which has a first dopant type;
   providing a second doped region, which directly contacts the first doped region and has a second dopant type;
   providing a third doped region, which directly contacts the first doped region and has the second dopant type;
   providing a first dielectric layer, which directly contacts each of the first doped region, the second doped region, and the third doped region;
   providing a first gate member, which is conductive and comprises a first gate portion, a second gate portion, and a third gate portion, wherein the first gate portion directly contacts the first dielectric layer and is positioned between the second doped region and the third doped region, wherein the second gate portion is positioned between the first gate portion and the third gate portion, and wherein a width of the second portion is unequal to a width of the third gate portion;
   providing a doped portion, which is positioned between the third gate portion and the third doped region;
   providing a second dielectric layer, which overlaps the third gate portion;
   providing a second gate member, which is conductive and overlaps the second dielectric layer;
   providing a source region at the second doped region; and
   providing a drain region at the third doped region.

2. The method of claim 1 comprising:
   providing a substrate member that has a trench;
   providing a first dielectric material layer inside the trench;
   providing a protective member inside the trench, such that the protective member is positioned between two portions of the first dielectric material layer;
   partially protecting the first dielectric material layer using the protective member when partially removing the first dielectric material layer to form the first dielectric layer, wherein a top side of the first dielectric layer is lower than a top side of the substrate member and is higher than a top side of the first doped region with respect to a bottom of the substrate member; and
   removing the protective member.

3. The method of claim 2 comprising:
   providing a conductive material layer on the first dielectric and on the substrate member, wherein a portion of the conductive material layer is positioned inside the trench; and
   etching the conductive material and the substrate member to form the first gate member and a remaining substrate member, wherein a surface of the remaining substrate member is flush with the top side of the first dielectric layer.

4. The method of claim 1 comprising:
   heating at least the first gate member to cause dopant elements to move from the first gate member to the doped portion.

5. The method of claim 1 comprising:
   configuring a width of a portion of the second gate member to configure a length of a tunnel field-effect transistor structure between the first gate member and the drain region,
   wherein a portion of the second dielectric layer directly contacts each of the doped portion and the portion of the second gate member and is positioned between the doped portion and the portion of the second gate member.

6. The method of claim 1, wherein at least one of a dielectric constant of the first dielectric layer and a dielectric constant of the second dielectric layer is greater than or equal to 3.9.

* * * * *